(12) United States Patent
Shiozawa

(10) Patent No.: US 7,195,935 B2
(45) Date of Patent: Mar. 27, 2007

(54) SELECTIVE PACKAGING OF TESTED SEMICONDUCTOR DEVICES

(75) Inventor: Masakuni Shiozawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 10/966,114

(22) Filed: Oct. 15, 2004

(65) Prior Publication Data

US 2005/0263759 A1    Dec. 1, 2005

(30) Foreign Application Priority Data

Oct. 17, 2003    (JP) ............................. 2003-358076

(51) Int. Cl.
*H01L 21/00* (2006.01)
(52) U.S. Cl. ................. 438/15; 257/E21.525
(58) Field of Classification Search ............... 438/15; 324/76.11
See application file for complete search history.

(56) References Cited

U.S. PATENT DOCUMENTS

| | | | |
|---|---|---|---|
| 5,222,014 A | | 6/1993 | Lin |
| 6,589,801 B1 * | | 7/2003 | Yoon et al. ................ 438/15 |
| 2003/0224542 A1 * | | 12/2003 | Liu .......................... 438/15 |

FOREIGN PATENT DOCUMENTS

| | | |
|---|---|---|
| JP | 01-098253 | 4/1989 |
| JP | 06-013541 | 1/1994 |
| JP | 08-204123 | 8/1996 |
| JP | 08-213548 | 8/1996 |
| JP | 10-084076 | 3/1998 |
| JP | 2001-257310 | 9/2001 |
| JP | 2002-299384 | 10/2002 |
| JP | 2002-329813 | 11/2002 |
| JP | 2003-501805 | 1/2003 |
| JP | 2004-253667 | 9/2004 |
| JP | 2004-273938 | 9/2004 |
| WO | 00/74136 | 12/2000 |

OTHER PUBLICATIONS

Japanese Publication No. 06-013541 corresponds to U.S. Patent No. 5,222,014.

* cited by examiner

*Primary Examiner*—W. David Coleman
(74) *Attorney, Agent, or Firm*—Hogan & Hartson LLP

(57) ABSTRACT

A method for manufacturing a semiconductor device includes, (a) mounting a plurality of first semiconductor chips in a manner not to overlap with one another on a substrate having a plurality of wiring patterns formed thereon, and electrically connecting each of the first semiconductor chips to any one of the wiring patterns, (b) conducting an electrical examination on a plurality of mounted bodies each including one of the first semiconductor chips and any one of the wiring patterns electrically connected to each other, (c) stacking a second semiconductor chip on the first semiconductor chip of any one of the mounted bodies that pass the electrical examination, excluding any of the mounted bodies that fail the electrical examination and thereafter, (d) cutting the substrate so as to divide the wiring patterns. The electrical examination in step (b) includes a test on each of the wiring patterns, a test on each of the first semiconductor chips, and a test on an electrical connection state between each of the first semiconductor chips and a corresponding one of the wiring patterns, and wherein the electrical examination is a success when passing all of the tests, and the electrical examination is a failure when failing at least one of the tests.

13 Claims, 7 Drawing Sheets

SELECTIVE PACKAGING OF TESTED SEMICONDUCTOR DEVICES

BACKGROUND OF THE INVENTION

1. Field of the Invention

The present invention relates to semiconductor devices and method for manufacturing the same, semiconductor device modules, circuit substrates and electronic apparatuses.

2. Description of Related Art

Stacked type semiconductor devices having a plurality of stacked semiconductor chips have been developed. There is a problem with the conventional stacked type semiconductor devices because they are manufactured by stacking individual semiconductor chips, and therefore the productivity is poor.

It is an advantage of the present invention to improve the productivity of the stacked type semiconductor devices.

SUMMARY OF THE INVENTION

A method for manufacturing a semiconductor device in accordance with an embodiment of the present invention includes mounting a plurality of first semiconductor chips in a manner not to overlap with one another on a substrate having a plurality of wiring patterns formed thereon, and electrically connecting each of the first semiconductor chips to any one of the wiring patterns. The method also includes conducting an electrical examination on a plurality of mounted bodies each including one of the first semiconductor chips and any one of the wiring patterns electrically connected to each other, stacking a second semiconductor chip on the first semiconductor chip of any one of the mounted bodies that pass the electrical examination, excluding any of the mounted bodies that fail the electrical examination and thereafter cutting the substrate so as to divide the respective wiring patterns.

The electrical examination includes a test on each of the wiring patterns, a test on each of the first semiconductor chips, and a test on an electrical connection state between each of the first semiconductor chips and any one of the wiring patterns. The electrical examination is a success when passing all of the tests, and the electrical examination is a failure when failing at least one of the tests.

According to an embodiment of the present invention, the second semiconductor chips are not stacked on the first semiconductor chips of any of the mounting bodies that are rejected, and therefore the second semiconductor chips are not wasted. As a result, the productivity of the stacked type semiconductor devices is improved.

According to the method for manufacturing a semiconductor device, before mounting, a visual external examination may be conducted on the plurality of wiring patterns, and during mounting, any of the wiring patterns that fail the visual external examination may be excluded, and each of the wiring patterns that pass the visual external examination may be electrically connected to any one of the first semiconductor chips.

The method for manufacturing a semiconductor device according to an embodiment of the present invention may further include during stacking, electrically connecting the second semiconductor chip to any one of the wiring patterns and after stacking and before cutting, conducting a second electrical examination on each of the second semiconductor chips and any one of the wiring patterns electrically connected to each other. The second electrical examination includes a test on the second semiconductor chip, and a test on an electrical connection state between the second semiconductor chip and any one of the wiring patterns, wherein the second electrical examination may be a success when passing all of the tests, and the second electrical examination may be a failure when failing at least one of the tests.

The method for manufacturing a semiconductor device according to an embodiment of the present invention may further include before cutting, providing resin between the second semiconductor chip that passes the second electrical examination and any one of the first semiconductor chips therebelow, excluding any of the second semiconductor chips that fail the second electrical examination.

The method for manufacturing a semiconductor device according to an embodiment of the present invention may further include before cutting, providing on the substrate external terminals that overlap any of the second semiconductor chips that pass the second electrical examination and any of the first semiconductor chips therebelow, excluding a region that overlaps any of the second semiconductor chips that fail the second electrical examination and any of the first semiconductor chips therebelow.

According to the method for manufacturing a semiconductor device, during stacking, the second semiconductor chip that is in a pre-packaged state may be stacked on the first semiconductor chips.

According to the method for manufacturing a semiconductor device, each of the semiconductor chips may have electrodes, and during mounting, the first semiconductor chip may be mounted such that the electrodes are disposed opposite to the wiring patterns.

A semiconductor device in accordance with an embodiment of the present invention is manufactured by any of the methods recited above.

A circuit substrate in accordance with an embodiment of the present invention has the semiconductor device recited above mounted thereon.

An electronic equipment in accordance with an embodiment of the present invention has the semiconductor device recited above.

A semiconductor device module in accordance with an embodiment of the present invention includes a substrate having a plurality of wiring patterns formed thereon, a plurality of first semiconductor chips in a manner not to overlap one another on the substrate and a plurality of second semiconductor chips.

Each of the first semiconductor chips is electrically connected to any one of the wiring patterns.

An electrical examination is conducted on a plurality of mounted bodies each including one of the first semiconductor chips and any one of the wiring patterns electrically connected to each other, any of the mounted bodies that fail the electrical examination are excluded, and each of the second semiconductor chips is stacked on any one of the first semiconductor chips of any one of the mounted bodies that pass the electrical examination.

The electrical examination includes a test on each of the wiring patterns, a test on each of the first semiconductor chips, and a test on an electrical connection state between each of the first semiconductor chips and any one of the wiring patterns. The electrical examination is a success when passing all of the tests, and the electrical examination is a failure when failing at least one of the tests.

In the semiconductor device module in accordance with an embodiment of the present invention, any of the wiring patterns that fail a visual external examination may be excluded, and each of the first semiconductor chips may be electrically connected to any of the wiring patterns that pass the visual external examination.

BRIEF DESCRIPTION OF THE SEVERAL VIEWS OF THE DRAWINGS

FIG. 1 (B) is a partially expanded view of a cross section taken along lines IB—IB of the substrate shown in FIG. 1 (A).

FIG. 2 (B) is a partially expanded view of a cross section taken along lines IIB—IIB shown in FIG. 2 (A).

FIG. 3 (B) is a partially expanded view of a cross section taken along lines IIIB—IIIB shown in FIG. 3 (A).

FIG. 4 (B) is a partially expanded view of a cross section taken along lines IVB—IVB shown in FIG. 4 (A).

FIG. 5 (B) is a partially expanded view of a cross section taken along lines VB—VB shown in FIG. 5 (A).

FIG. 6 (B) is a partially expanded view of a cross section taken along lines VIB—VIB shown in FIG. 6 (A).

DETAILED DESCRIPTION OF THE INVENTION

Figure 1A:
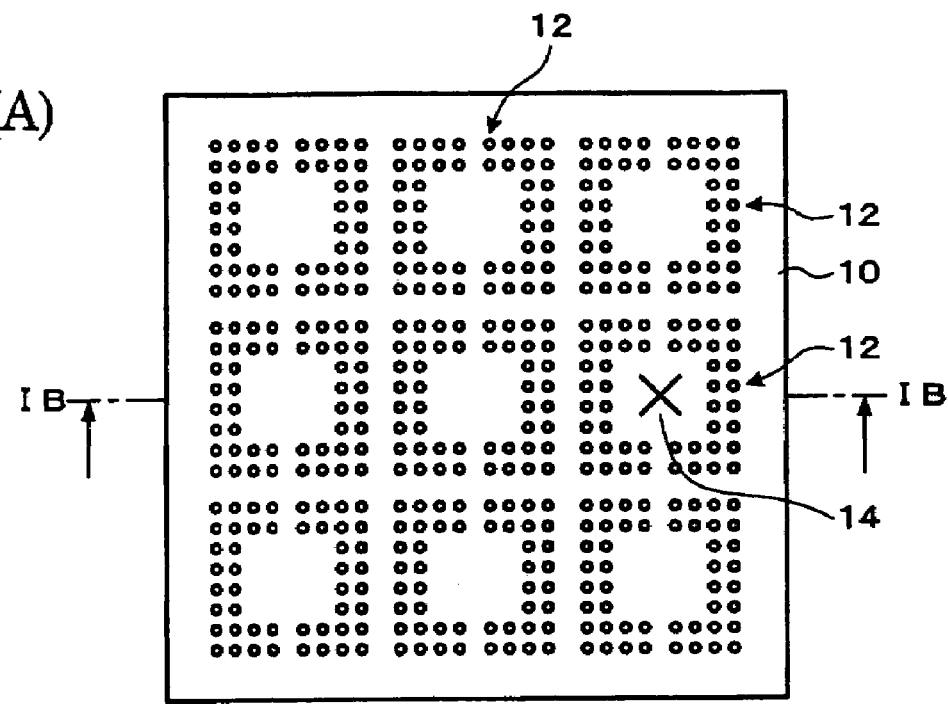
FIG. 1 (A) is a plan view for explaining a substrate used in a method for manufacturing a semiconductor device in accordance with an embodiment of the present invention.

Embodiments of the present invention are described below with reference to the accompanying drawings. FIG. 1 (A) is a plan view for explaining a substrate used in a method for manufacturing a semiconductor device in accordance with an embodiment of the present invention. FIG. 1 (B) is a partially expanded view of a cross section taken along lines IB—IB of the substrate shown in FIG. 1 (A).

An embodiment of the present invention uses a substrate 10. Each substrate 10 is provided for manufacturing a plurality of semiconductor devices. The substrate 10 may be in the form of a plate. The substrate 10 may be rectangular. The substrate 10 may be formed with a resin such as a polyimide resin, may be formed with a mixed material of an organic material such as a resin and an inorganic material, or may be a metallic substrate or a ceramic substrate if it can be cut.

A plurality of wiring patterns 12 is formed in the substrate 10. Each of the wiring patterns 12 is formed in a portion that defines an interposer of an individual semiconductor device on the substrate 10. The wiring patterns 12 may have lands that become electrical connection sections between wirings that electrically connect two or more points and other parts. The wiring patterns 12 are formed on at least one of the surfaces of the substrate 10. The wiring patterns 12 may be formed on both sides of the substrate 10 that may be electrically connected via through holes not shown in the figure.

In the embodiment of the present invention, a visual external examination is conducted on the wiring patterns 12. More particularly, the visual external examination is conducted to inspect as to whether the wiring patterns 12 are according to the design, line breakage and/or short-circuits are present, and the like. The visual external examination may be conducted by visual observation, by using a microscope, or by using a camera and a monitor.

Examination results may be automatically outputted by using an automatic inspection apparatus. For example, a normal shape of the wiring pattern 12 is memorized in a memory in advance as a reference pattern, and a sample pattern that is obtained by imaging the wiring pattern 12 to be inspected by a camera is compared with the reference pattern. More specifically, an operation section calculates as to whether data of the sample pattern contains any data that is not included in data of the reference pattern. When the data of the sample pattern contains data that is not included in the data of the reference pattern (for example, when a part of the sample pattern protrudes from the reference pattern), it is detected that the wiring pattern 12 is not according to the design (for example, a short-circuit occurs).

In addition to the process described above or without conducting the process described above, a negative shape of a normal shape of the wiring pattern 12 may be memorized in the memory in advance as a negative reference pattern. A negative shape of a sample pattern obtained by imaging the wiring pattern 12 to be inspected is generated as a negative sample pattern by the operation section. Then, the negative sample pattern is compared with the negative reference pattern. More specifically, the operation section calculates as to whether data of the negative sample pattern contains any data that is not included in data of the negative reference pattern. When the data of the negative sample pattern contains data that is not included in the data of the negative reference pattern (for example, when a part of the negative sample pattern protrudes from the negative reference pattern), it is detected that the wiring pattern 12 is not according to the design. In this case, a portion of the negative sample pattern which does not exist in the negative reference pattern is a portion that is missing from the wiring pattern 12 (for example, a portion where a line is disconnected). Accordingly, it can be detected that the wiring pattern 12 has a line breakage.

In addition, an electrical examination can be conducted on the wiring patterns 12. The electrical examination may include at least one of a conduction test and an insulation (resistance) test on the wiring patterns 12. In the conduction test, a probe may be brought in contact with two sections of the wiring pattern 12 (for instance, edge sections), and the presence of electrical conduction may be measured. In the insulation (resistance) test, a probe may be brought in contact with two sections that should be insulated according to the design, and the presence of insulation (resistance value) may be measured. Since there may be an electrical resistance in an electrically conductive part, and an electrical current may slightly flow to an insulated part, conduction or insulation is judged based on a predetermined value as a boundary value between them.

Figure 1B:
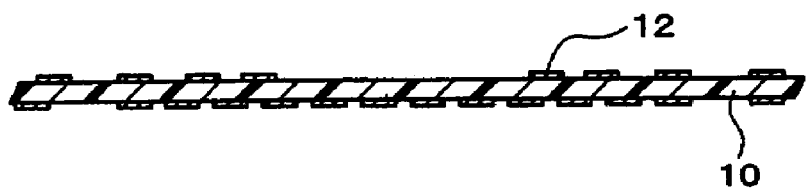

As shown in FIG. 1(A), marks 14 may be appended to indicate any of the wiring patterns 12 that fail the visual external examination (and in addition, the electrical examination if needed).

Figure 2A:
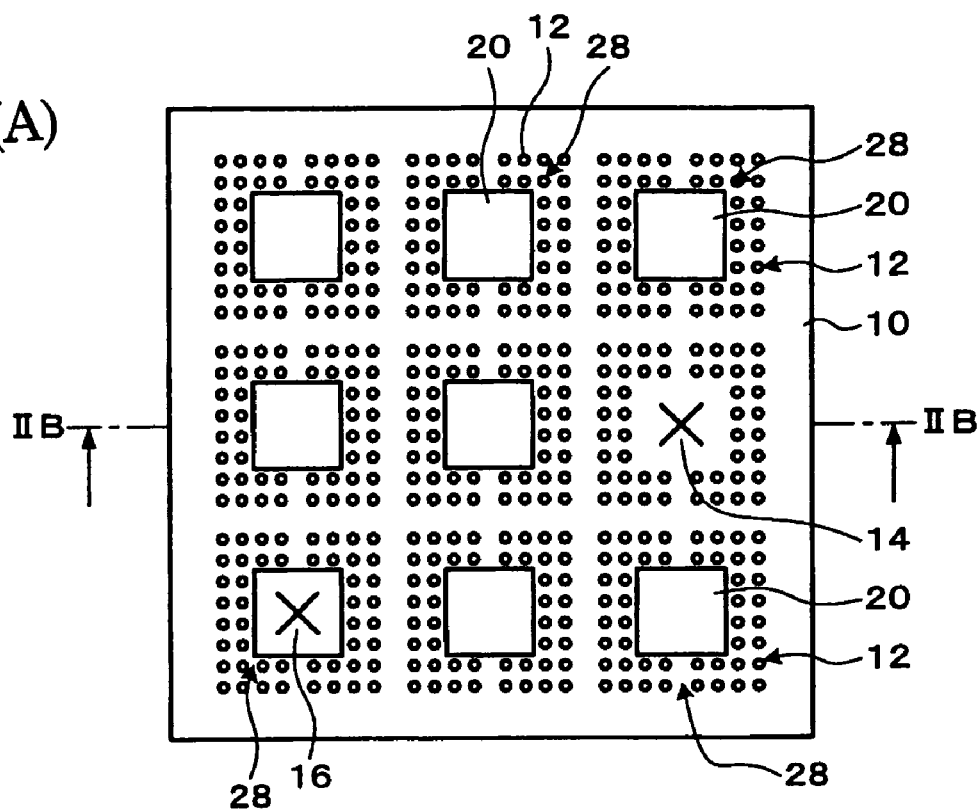
FIG. 2 (A) is a plan view for explaining a method for manufacturing a semiconductor device in accordance with an embodiment of the present invention.
Figure 2B:
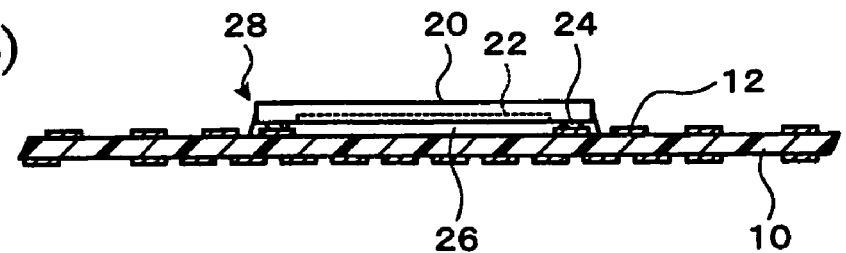

FIG. 2 (A) is a plan view for explaining a method for manufacturing a semiconductor device in accordance with an embodiment of the present invention. FIG. 2 (B) is a partially expanded view of a cross section taken along lines IIB—IIB shown in FIG. 2 (A).

An embodiment of the present invention uses first semiconductor chips 20. Each of the semiconductor chips 20 includes an integrated circuit 22 formed therein. The first semiconductor chip 20 has one or a plurality of electrodes 24. The electrodes may include pads and bumps formed on the pads. The electrodes 24 may be formed on a surface of the first semiconductor chip where the integrated circuit 22 is formed. The first semiconductor chip 20 may be a bare chip.

The plural first semiconductor chips 20 are mounted on the substrate 10. The first semiconductor chips 20 may be mounted such that the electrodes 24 are disposed opposite to the wiring patterns 12. The plural first semiconductor chips 20 are arranged so as not to overlap with one another. Each of the first semiconductor chips 20 is disposed in an area where any one of the wiring patterns 12 is formed. The first semiconductor chips 20 are not disposed in areas where any of the wiring patterns 12 that failed the visual external examination (and in addition, the electrical examination, if needed) are formed (for example, those indicated by the marks 14). In other words, the first semiconductor chips 20 are disposed in areas where any of the wiring patterns 12 that passed the visual external examination (and in addition, the electrical examination, if needed) are formed.

Each of the first semiconductor chips 20 is electrically connected to any one of the wiring patterns 12. The first semiconductor chips 20 are not electrically connected to any of the wiring patterns 12 that failed the visual external examination (and in addition, the electrical examination, if needed) (for example, those indicated by the marks 14). In other words, the first semiconductor chips 20 are electrically connected to respective ones of the wiring patterns 12 that passed the visual external examination (and in addition, the electrical examination, if needed).

The first semiconductor chips 20 and the substrate 10 may be bonded with an adhesive 26. The adhesive 26 may be a resin. The adhesive 26 may be curable by energy (thermosetting, ultraviolet-curable, or the like). The adhesive 26 may be electrically nonconductive.

The first semiconductor chips 20 may be face-down bonded to the substrate 10. In this case, the electrodes 24 of the first semiconductor chips 20 and the wiring patterns 12 are disposed opposite and electrically connected to one another. If the adhesive 26 is an anisotropic conductive material (an anisotropic electroconductive film, an anisotropic electroconductive paste, or the like), an electrical connection can be provided with anisotropic conductive particles. If the adhesive 26 is a nonconductive adhesive, its shrinkage force can be used to pressure-bond the electrodes 24 and the wiring patterns 12. Alternatively, the electrodes 24 and the wiring patterns 12 may be bonded by metal junctions. As a modified example, the first semiconductor chips 20 may be face-up bonded to the substrate 10 (such that the surface where the electrodes 24 are formed facing in an opposite direction of the substrate 10), and wires may be used for their electrical connection.

Next, an electrical examination is conducted on a plurality of mounted bodies 28 each including the first semiconductor chip 20 and any one of the wiring patterns 12 electrically connected with each other. The electrical examination may include a test on each of the wiring patterns 12, a test on each of the first semiconductor chips 20, and a test on an electrical connection state between each of the first semiconductor chips 20 and a corresponding one of the wiring patterns 12.

Each of the tests in the electrical examination may include at least one of a conduction test, an insulation (resistance) test, and a characteristic test. In the conduction test, a probe may be brought in contact with two sections (for instance, edge sections), and the presence of electrical conduction may be measured. In the insulation (resistance) test, a probe may be brought in contact with two sections that should be insulated according to the design, and the presence of insulation (resistance value) may be measured. Since an electrically conductive part may have an electrical resistance, and an electrical current may slightly flow to an insulated part, conduction or insulation is judged based on a predetermined value as a boundary value between them. The characteristic test is conducted on, for example, the first semiconductor chip 20 to inspect as to whether the integrated circuit 22 has the designed characteristics.

When they pass all of the tests, they are deemed to have passed the electrical examination. If they fail at least one of the tests, they are deemed to have failed the electrical examination (hereafter referred to as the "first electrical examination"). Marks 16 may be appended to indicate those of the mounted bodies 28 that have been rejected.

Figure 3A:
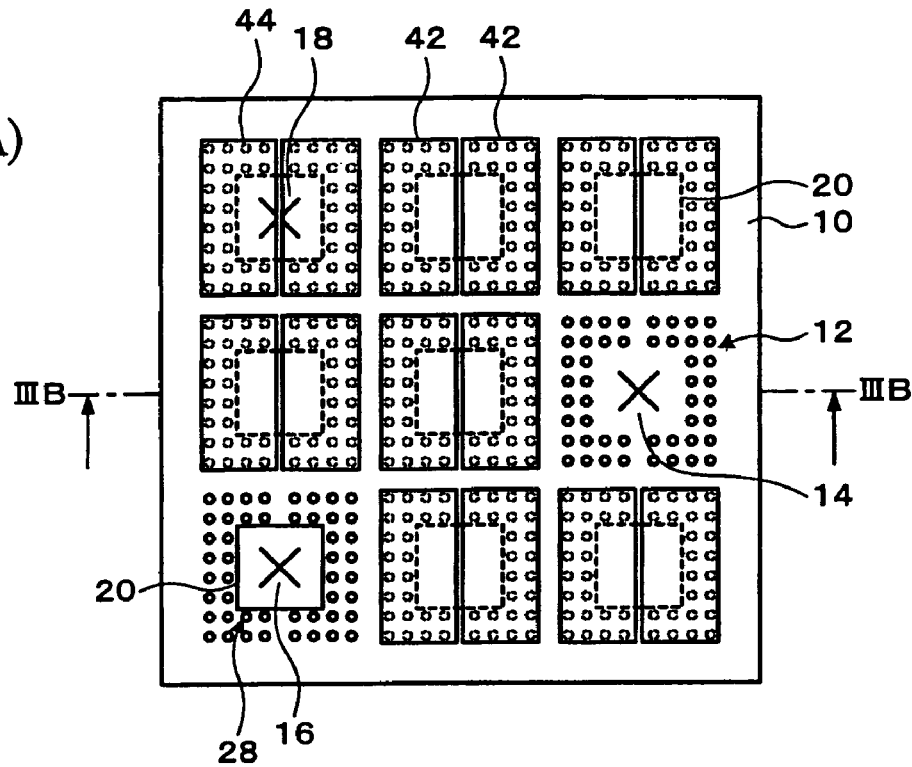
FIG. 3 (A) is a plan view for explaining a method for manufacturing a semiconductor device in accordance with an embodiment of the present invention.
Figure 3B:
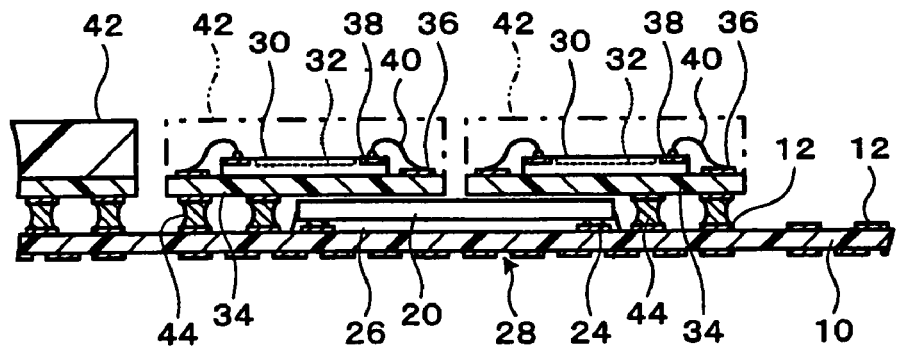

FIG. 3 (A) is a plan view for explaining a method for manufacturing a semiconductor device in accordance with an embodiment of the present invention. FIG. 3 (B) is a partially expanded view of a cross section taken along lines IIIB—IIIB shown in FIG. 3 (A).

According to an embodiment of the present invention, one or a plurality of second semiconductor chips 30 are stacked on the first semiconductor chip 20. Integrated circuits 32 are formed in the second semiconductor chips 30. In the example shown in FIG. 3(A), the plural second semiconductor chips 30 are arranged so as not to overlap with one another. The second semiconductor chips 30 are not stacked on the first semiconductor chips 20 of any of the mounted bodies 28 that failed the electrical examination. The second semiconductor chips 30 are stacked on the first semiconductor chips 20 of those of the mounted bodies 28 that passed the electrical examination. According to the present embodiment, because the second semiconductor chips 30 are not stacked on the first semiconductor chips 20 of those of the mounting bodies 28 that are rejected, the second semiconductor chips 30 are not wasted. Therefore, the productivity of the stacked type semiconductor devices improves.

The second semiconductor chip 30 may be stacked on any of the first semiconductor chips 20 in a pre-packaged state. For example, the second semiconductor chip 30 may be mounted on a second substrate 34. The description about the substrate 10 is applicable to the second substrate 34. In addition, the second substrate 34 may be formed with the same material and/or in the same thickness, and may have the same coefficient of thermal expansion as that of the substrate 10. Alternatively, the second substrate 34 may be formed with a material different from that of the substrate 10, and/or formed in a different thickness. Also, either the substrate 10 or the second substrate 34 may have a coefficient of thermal expansion greater than the other. The coefficient of thermal expansion is a coefficient of expansion that takes place when heating, as well as a coefficient of contraction that takes place when cooling. Second wiring patterns 36 are formed on the second substrate 34. The description about the wiring patterns 12 is applicable to the second wiring patterns 36. The second semiconductor chip 30 may be bonded to the second substrate 34 with an adhesive not shown in the figure.

The second semiconductor chips 30 may be electrically connected to the second wiring patterns 36. The second semiconductor chips 30 may be face-up bonded to the second substrates 34 (such that the electrodes 38 face upward). In this case, the electrodes 38 of the second semiconductor chips 30 and the second wiring patterns 36 may be bonded with wires 40. As a modified example, the second semiconductor chips 30 may be face-down bonded to the second substrates 34. The content about the first semiconductor chips 20 is applicable to their electrical connection.

Moreover, the second semiconductor chip 30 may be sealed by a sealing part 42. The sealing part 42 may seal an electrical joint section (for example, the wires 40). The sealing part 42 is provided at the second substrate 34. The sealing part 42 may be formed by transfer molding. The sealing part 42 may be formed to overlap a plurality of contacting parts 44 described later. The sealing part 42 may be formed with a resin (for example, a molding resin). The sealing part 42 may have a coefficient of thermal expansion that is smaller than that of the substrate 10, and a coefficient of thermal expansion that is smaller than that of the second substrates 34. To reduce the coefficient of thermal expansion, the sealing part 42 may contain silica. Even when the individual coefficients of thermal expansion of the substrate 10 and the second substrate 34 are the same, the coefficient of thermal expansion of the second substrate 34 may become smaller than that of the substrate 10 due to the provision of the sealing part 42.

When each of the second semiconductor chips 30 is made into a package, adjacent ones of the second substrates 34 or the sealing parts 42 are arranged with a space provided therebetween so as not to overlap with one another. A part of the second substrate 34 (which is end sections that surround the first semiconductor chip 20 from three directions in a manner to include two corners thereof in the example shown in FIG. 3 (A), and may be edge sections that surround the first semiconductor chip 20 from one direction or two directions in a modified example) may be disposed above and to overlap with a part of the substrate 10 (a part excluding the region where the first semiconductor chip 20 is mounted). A part of the second substrate 34 (which is an end section excluding corners thereof in the example shown in FIG. 3 (A), and may be corners in a modified example) may be disposed above and to overlap with a part of the first semiconductor chip 20 (which is an integrated part of two corners in the example shown in FIG. 3 (A), and may be an integrated part of three corners or one corner in a modified example). The entirety of the second substrate 34 may be disposed above and to overlap a part of the substrate 19 and a part of the first semiconductor chip 20.

The second substrate 34 may be stacked on the side of the substrate 10 having the first semiconductor chip 20 mounted thereon. The side of the second substrate 34 on which the second semiconductor chip 30 is mounted may be disposed on the opposite side of the first semiconductor chip 20 on the substrate 10.

In an embodiment of the present invention, the second semiconductor chips 30 are electrically connected to corresponding ones of the wiring patterns 12 formed on the substrate 10. For example, a plurality of contacting parts 44 may be provided between the substrate 10 and the second substrates 34. For example, a part of the wiring patterns 36 (for example, lands) and a part of the second wiring patterns 12 (for instance, lands) may oppose one another, and the contacting parts 44 may be provided between these opposing parts. The contacting parts 44 may be formed with either soft solder or hard solder. Solder that does not contain lead (hereafter, referred to as "lead free solder") can be used as the soft solder. An alloy, such as, a tin-silver (Sn—Ag) alloy, a tin-bismuth (Sn—Bi) alloy, a tin-zinc (Sn—Zn) alloy, or a tin-copper (Sn—Cu) alloy can be used as the lead free solder. In addition, at least one of silver, bismuth, zinc and copper may be added to the alloy. These materials may be melted by a reflow process to form the contacting parts 44. Because the contacting parts 44 electrically connect the wiring patterns 12 and the second wiring patterns 36, the second semiconductor chip 30 and the wiring patterns 12 can be electrically connected through the second wiring patterns 36.

In an embodiment of the present invention, a second electric examination on the second semiconductor chips 30 and any of the wiring patterns 12 electrically connected with one another may be further included. The second electrical examination may include a test on the second semiconductor chips 30, and a test on an electrical connection between the second semiconductor chips 30 and corresponding ones of the wiring patterns 12. The first electrical examination described above may be conducted again in the second electrical examination.

Each of the electrical tests of the second electrical examination may include at least one of a conduction test, an insulation (resistance) test, and a characteristic test. In the conduction test, a probe may be brought in contact with two sections (for instance, edge sections), and the presence of electrical conduction may be measured. In the insulation (resistance) test, a probe may be brought in contact with two sections that should be insulated according to the design, and the presence of insulation (resistance value) may be measured. Since there may be an electrical resistance in an electrically conductive part, and an electrical current may slightly flow to an insulated part, conduction or insulation is judged based on a predetermined value as a boundary value between them. The characteristic test is conducted on, for example, the second semiconductor chip 30 to inspect as to whether the integrated circuit 32 has the designed characteristics.

When they pass all of the tests, they are deemed to have passed the second electrical examination. If they fail at least one of the tests, they are deemed to have failed the second electrical examination. Marks 18 may be appended to indicate failures when they have been rejected.

Figure 4A:
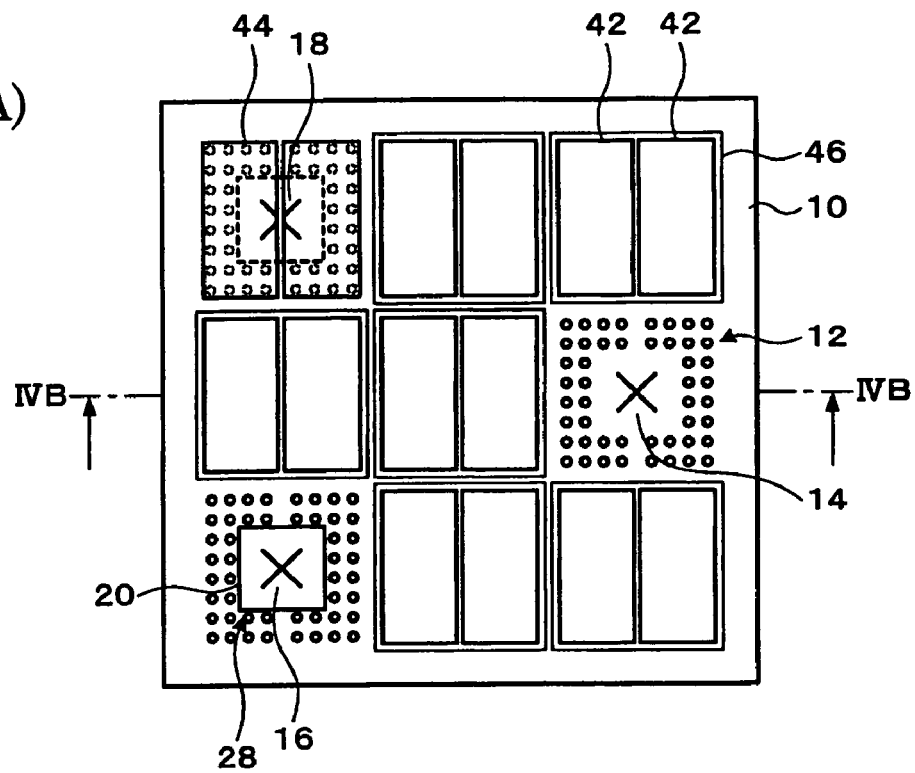
FIG. 4 (A) is a plan view for explaining a method for manufacturing a semiconductor device in accordance with an embodiment of the present invention.
Figure 4B:
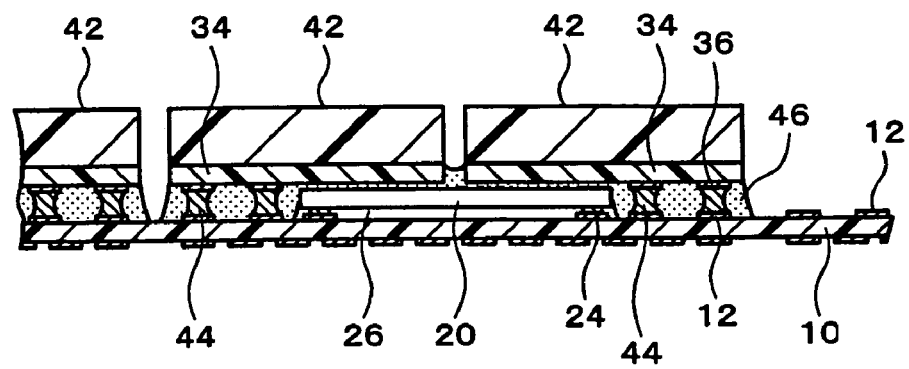

FIG. 4 (A) is a plan view for explaining a method for manufacturing a semiconductor device in accordance with an embodiment of the present invention. FIG. 4 (B) is a partially expanded view of a cross section taken along lines IVB—IVB shown in FIG. 4 (A).

According to an embodiment of the present invention, those of the second semiconductor chips 30 that have failed the second electrical examination are excluded, and the step of providing a resin 46 (for example, an epoxy resin) between those of the second semiconductor chips 30 that have passed the second electrical examination and those of the first semiconductor chips 20 provided therebelow may be further included. More specifically, the resin 46 is provided between the substrate 10 and the second substrates 34, and between the first semiconductor chips 20 and the second substrates 34. The resin 46 may be injected through gaps (gaps above the first semiconductor chips 20) between adjacent ones of the plurality of semiconductor chips 30 (or the sealing parts 42). As a result, the resin 46 progresses in directions of the second semiconductor chips 30 (or, the sealing parts 42) from the gaps above the first semiconductor chip 20. In other words, because the resin 46 progresses in multiple directions, the injection work can be completed in a short time.

The resin 46 may bond the opposing surfaces of the substrate 10 and the second substrates 34 and the opposing surfaces of the second substrate 34 and the first semiconductor chips 20. The resin 46 may enter the gaps among the plural sealing parts 42. In this case, the resin 46 may touch (or, bond) only the edge surfaces of the second substrates 34, or may touch (or, bond) the edge surfaces of the second substrate 34 and the sealing parts 42.

Because the substrate 10 and the second substrates 34 are bonded with the resin 46, the contacting parts 44 can be reinforced. The resin 46 may be provided to enclose the contacting parts 44. Accordingly, the contacting parts 44 enclosed by the resin 46 do not flow out even when they are melted by heat.

After providing the resin 46, a third electrical examination may be conducted. The third electrical examination may include the contents of at least one of the first and second electrical examinations. In addition, the third electrical examination may include a test on electrical connections between the wiring patterns 12 and the second wiring patterns 36 at the contacting parts 44.

When they pass all of the tests, they are deemed to have passed the third electrical examination. If they fail at least one of the tests, they are deemed to have failed the second electrical examination. Marks 48 may be appended to indicate failures when they have been rejected.

Figure 5A:
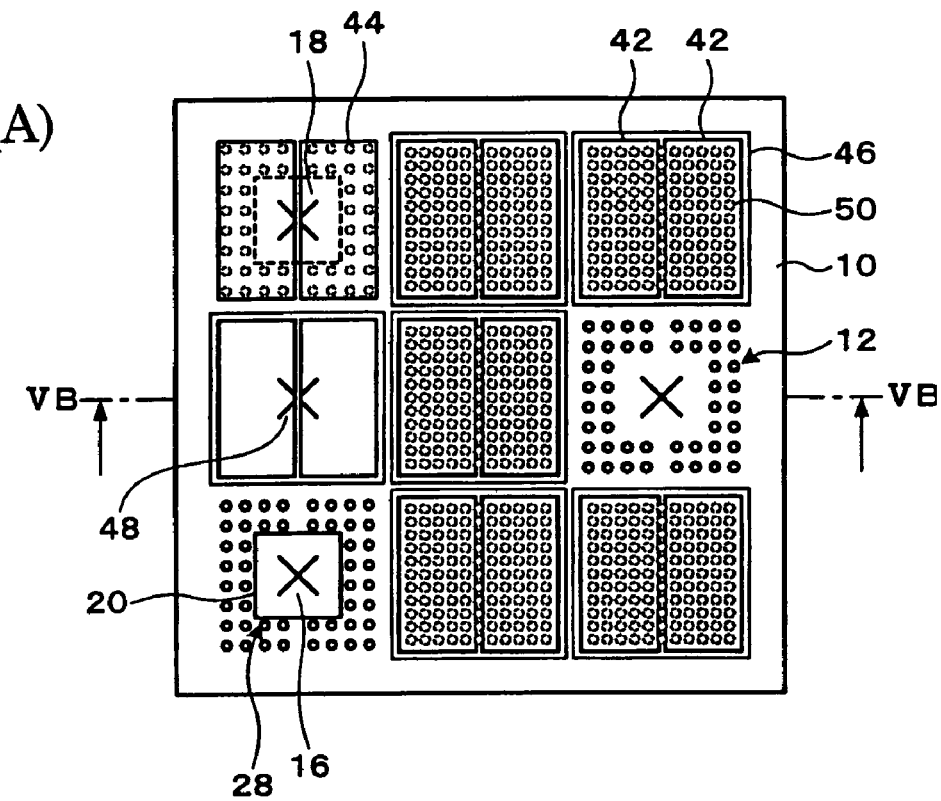
FIG. 5 (A) is a plan view for explaining a method for manufacturing a semiconductor device in accordance with an embodiment of the present invention.
Figure 5B:
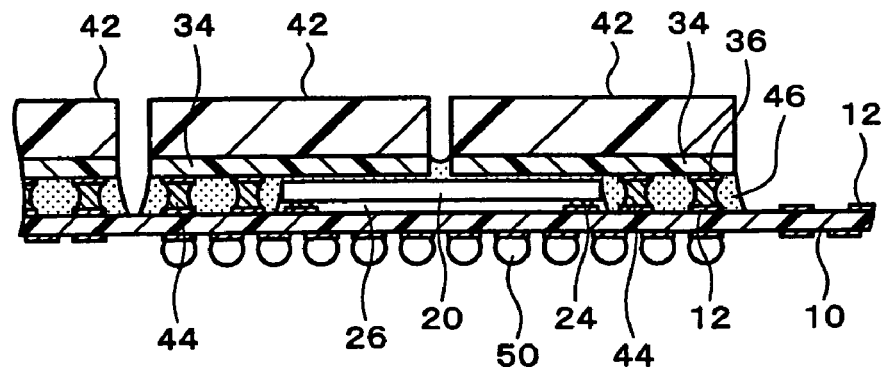

FIG. 5 (A) is a plan view for explaining a method for manufacturing a semiconductor device in accordance with an embodiment of the present invention. FIG. 5 (B) is a partially expanded view of a cross section taken along lines VB—VB shown in FIG. 5 (A).

The method for manufacturing a semiconductor device according to an embodiment of the present invention may include providing a plurality of external terminals 50 (for example, solder balls).

The external terminals 50 are provided on a surface of the substrate 10 which is on the opposite side of the surface where the first semiconductor chips 20 are mounted. The external terminals 50 may be provided on lands that become parts of the wiring patterns 12. The external terminals 50 may be formed with either soft solder or hard solder. Lead free solder described above may be used as the soft solder.

The external terminals 50 may be provided in areas other than the areas which overlap those of the second semiconductor chips 30 that have failed the second electrical examination and those of the first semiconductor chips therebelow. The external terminals 50 may be provided to overlap those of the second semiconductor chips 30 that have passed the second electrical examination and those of the first semiconductor chips 20 therebelow.

FIG. 5 (A) and FIG. 5 (B) are also figures for explaining a semiconductor device module in accordance with an embodiment of the present invention. The semiconductor device module has a substrate 10 with which a plurality of wiring patterns 12 are formed. The semiconductor device module has a plurality of first semiconductor chips 20 mounted on the substrate 10 arranged in a manner not to overlap with one another. The semiconductor device module has a plurality of second semiconductor chips 30. Each of the first semiconductor chips 20 is electrically connected with corresponding ones of the wiring patterns 12. Each of the first semiconductor chips 20 may be electrically connected with any of the wiring patterns 12 that have passed the visual external examination, excluding any of the wiring patterns 12 that failed the visual external examination.

An electrical examination is conducted on a plurality of mounted bodies 28 each including the first semiconductor chip 20 and any of the wiring patterns 12 that are electrically connected with each other. Excluding any of the mounted bodies 28 that failed the electrical examination, the second semiconductor chips 30 are stacked on the first semiconductor chips 20 of those of the mounted bodies 28 that passed the electrical examination.

The electrical examination may include a test on each of the wiring patterns 12, a test on each of the first semiconductor chips 20, and a test on an electrical connection state between each of the first semiconductor chips 20 and a corresponding one of the wiring patterns 12. When they pass all of the tests, they are deemed to have passed the electrical examination. If they fail at least one of the tests, they are deemed to have failed the electrical examination.

The method for manufacturing the semiconductor device in accordance with an embodiment of the present invention includes cutting the substrate 10. More specifically, the substrate 10 is cut in a manner to divide the wiring patterns 12. The semiconductor devices can be manufactured through the steps described above.

Figure 6A:
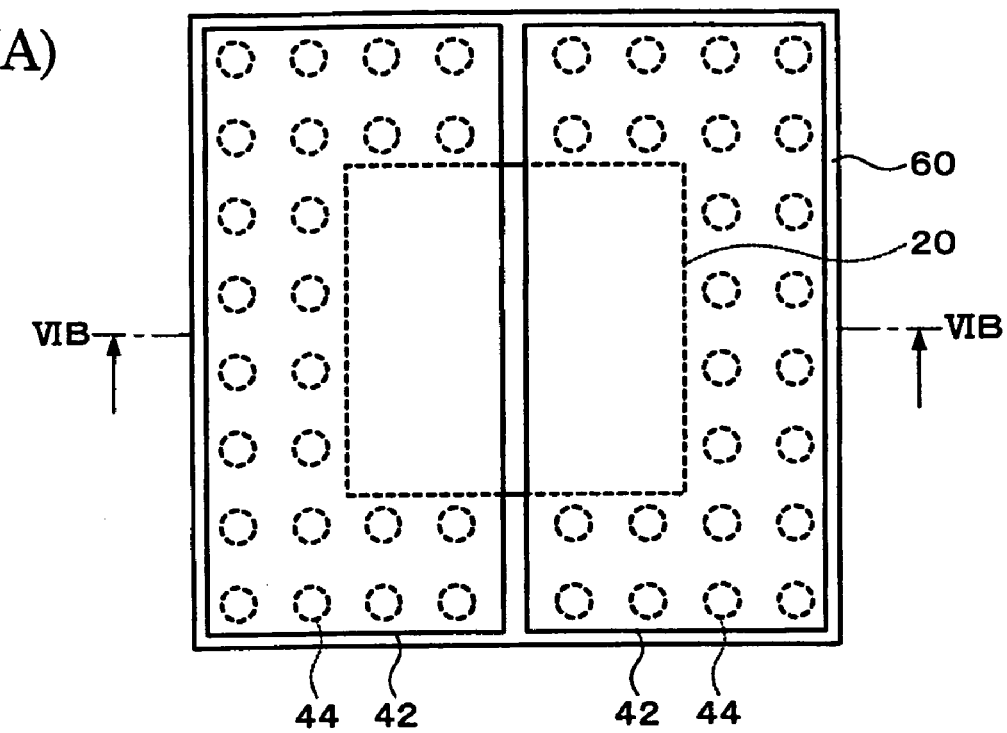
FIG. 6 (A) is a plan view of a semiconductor device in accordance with an embodiment of the present invention.
Figure 6B:
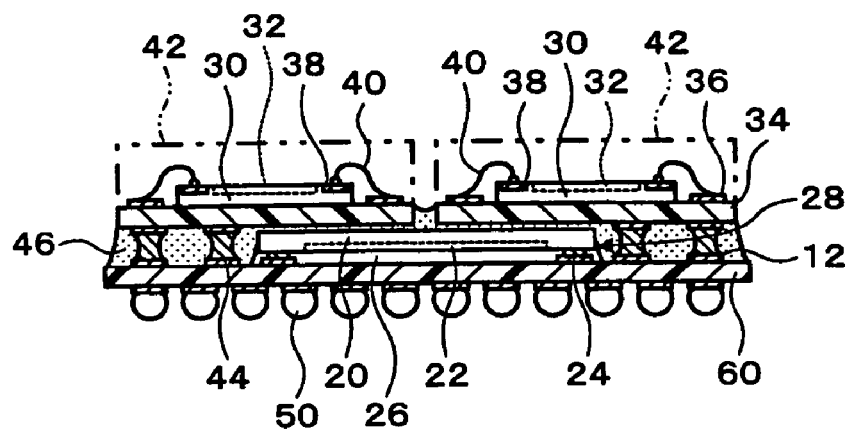

FIG. 6 (A) is a plan view of a semiconductor device in accordance with an embodiment of the present invention. FIG. 6 (B) is a partially expanded view of a cross section taken along lines VIB—VIB shown in FIG. 6 (A). The semiconductor device includes a substrate 60. The substrate 60 is obtained by being cut from the substrate 10 described above. Other compositions of the semiconductor device include the contents that can be led from the manufacturing method described above.

Figure 7:
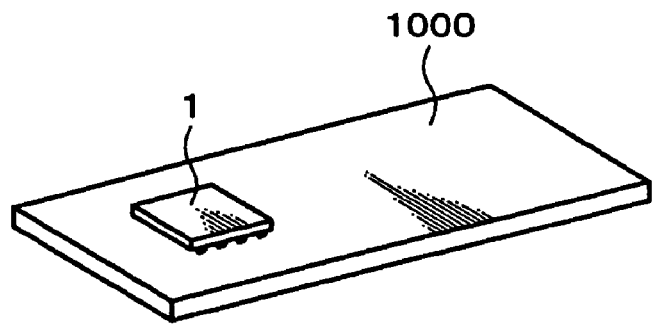
FIG. 7 shows a circuit substrate on which the semiconductor device in accordance with any of the embodiments is mounted.
Figure 8:
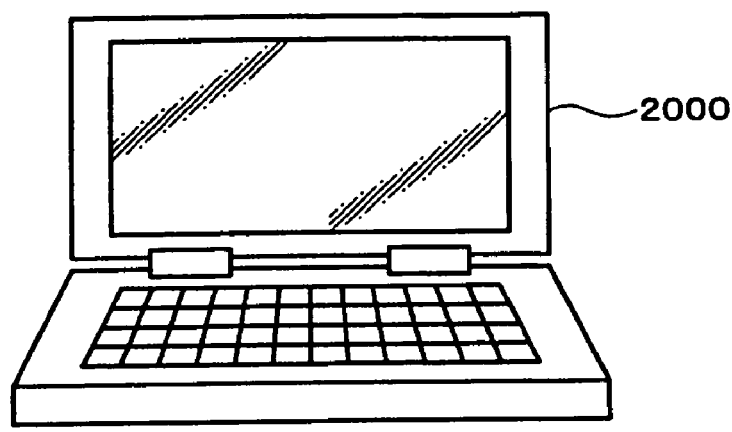
FIG. 8 shows an electronic device having the semiconductor device in accordance with any of the embodiments.
Figure 9:
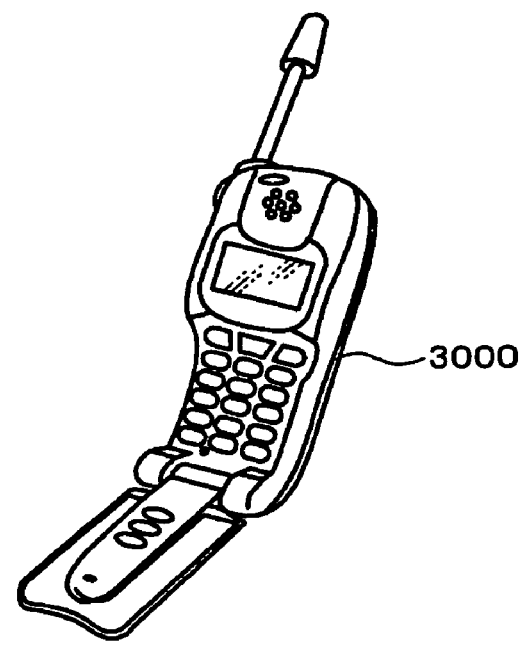
FIG. 9 shows an electronic device having the semiconductor device in accordance with any of the embodiments.

FIG. 7 shows a circuit substrate 1000 on which the semiconductor device 1 described above in any of the embodiments of the present invention is mounted. Also, as electronic devices having the semiconductor device, a notebook type personal computer 2000 is shown in FIG. 8, and a portable telephone 3000 is shown in FIG. 9.

The present invention is not limited to the embodiments described above, and many modification can be made. For example, the present invention may include compositions that are substantially the same as the compositions described in the embodiments (for example, a composition that has the same functions, the same methods and the results, or a composition that has the same advantages and effects). Also, the present invention includes compositions in which portions not essential in the compositions described in the embodiments are replaced with others. Also, the present invention includes compositions that achieve the same functions and effects or achieve the same advantages as those of the compositions described in the embodiments. Furthermore, the present invention includes compositions that include known technology added to the compositions described in the embodiments. Moreover, the present invention includes contents that limitedly exclude any of the technical matters described in the embodiments. Alternatively, the present invention includes contents that limitedly exclude a known technology from the embodiments described above.

What is claimed is:

1. A method for manufacturing a semiconductor device, comprising:

(a) mounting a plurality of first semiconductor chips in a manner not to overlap with one another on a substrate having a plurality of wiring patterns formed thereon, and electrically connecting each of the first semiconductor chips to any one of the wiring patterns;

(b) conducting an electrical examination on a plurality of mounted bodies each including one of the first semiconductor chips and any one of the wiring patterns electrically connected to each other;

(c) stacking a second semiconductor chip on the first semiconductor chip of any one of the mounted bodies that pass the electrical examination, excluding any of the mounted bodies that fail the electrical examination; and thereafter (d) cutting the substrate so as to divide the wiring patterns, wherein the electrical examination in step (b) includes a test on each of the wiring patterns, a test on each of the first semiconductor chips, and a test on an electrical connection state between each of the first semiconductor chips and a corresponding one of the wiring patterns, and wherein the electrical examination is a success when passing all of the tests, and the electrical examination is a failure when failing at least one of the tests.

2. The method for manufacturing a semiconductor device according to claim 1, wherein before step (a), a visual external examination is conducted on the plurality of wiring patterns, and in step (a), any of the wiring patterns that fail the visual external examination are excluded, and each of the wiring patterns that pass the visual external examination is electrically connected to a corresponding one of the first semiconductor chips.

3. The method for manufacturing a semiconductor device according to claim 2, wherein in step (c), electrically connecting the second semiconductor chip to any one of the wiring patterns, and after step (c) and before step (d), conducting a second electrical examination on the second semiconductor chip and any one of the wiring patterns electrically connected to each other, wherein the second electrical examination includes a test on the second semiconductor chip, and a test on an electrical connection state between the second semiconductor chip and any one of the wiring patterns, wherein the second electrical examination is a success when passing all of the tests of the second electrical examination, and the second electrical examination is a failure when failing at least one of the tests of the second electrical examination.

4. The method for manufacturing a semiconductor device according to claim 2, wherein, in step (c), the second semiconductor chip that is in a pre packaged state is stacked on the first semiconductor chip.

5. The method for manufacturing a semiconductor device according to claim 1 wherein in step (c), electrically connecting the second semiconductor chip to any one of the wiring patterns, and after step (c) and before step (d), conducting a second electrical examination on the second semiconductor chip and any one of the wiring patterns electrically connected to each other, wherein the second electrical examination includes a test on the second semiconductor chip, and a test on an electrical connection state between the second semiconductor chip and any one of the wiring patterns, wherein the second electrical examination is a success when passing all of the tests of the second electrical examination, and the second electrical examination is a failure when failing at least one of the tests of the second electrical examination.

6. The method for manufacturing a semiconductor device according to claim 5, wherein before step (d), providing resin between the second semiconductor chip that passes the second electrical examination and any one of the first semiconductor chips therebelow, excluding any of the second semiconductor chips that fail the second electrical examination.

7. The method for manufacturing a semiconductor device according to claim 6, wherein before step (d), providing on the substrate, external terminals that overlap any of the second semiconductor chips that pass the second electrical examination and any of the first semiconductor chips therebelow, excluding a region that overlaps any of the second semiconductor chips that fail the second electrical examination and any of the first semiconductor chips therebelow.

8. The method for manufacturing a semiconductor device according to claim 5 wherein before step (d), providing on the substrate, external terminals that overlap any of the second semiconductor chips that pass the second electrical examination and any of the first semiconductor chips therebelow, excluding a region that overlaps any of the second semiconductor chips that fail the second electrical examination and any of the first semiconductor chips therebelow.

9. The method for manufacturing a semiconductor device according to claim 1, wherein, in step (c), the second semiconductor chip that is in a pre-packaged state is stacked on the first semiconductor chip.

10. The method for manufacturing a semiconductor device according to claim 1, wherein each of the first and second semiconductor chips has electrodes, and in step (a), the first semiconductor chip is mounted such that the electrodes are provided opposite to the wiring patterns.

11. A semiconductor device that is manufactured by the method recited in claim 1.

12. A circuit substrate having a semiconductor device recited in claim 11 mounted thereon.

13. An electronic equipment having a semiconductor device recited in claim 11.

* * * * *